United States Patent
Katano

(10) Patent No.: US 10,288,690 B2
(45) Date of Patent: May 14, 2019

(54) VOLTAGE MEASUREMENT METHOD FOR BATTERY

(71) Applicant: TOYOTA JIDOSHA KABUSHIKI KAISHA, Toyota-shi, Aichi-ken (JP)

(72) Inventor: Koji Katano, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 223 days.

(21) Appl. No.: 15/447,874

(22) Filed: Mar. 2, 2017

(65) Prior Publication Data
US 2017/0254855 A1 Sep. 7, 2017

(30) Foreign Application Priority Data
Mar. 7, 2016 (JP) .................. 2016-043214

(51) Int. Cl.
*G01R 31/36* (2006.01)
*H02J 7/00* (2006.01)

(52) U.S. Cl.
CPC ....... *G01R 31/362* (2013.01); *G01R 31/3658* (2013.01); *H02J 7/0021* (2013.01)

(58) Field of Classification Search
None
See application file for complete search history.

(56) References Cited

U.S. PATENT DOCUMENTS

| 5,932,932 A * | 8/1999 | Agatsuma ............. B60K 6/48 307/10.6 |
| 2007/0216355 A1* | 9/2007 | Kim ................. H02J 7/0024 320/128 |
| 2014/0239897 A1 | 8/2014 | Song et al. |

FOREIGN PATENT DOCUMENTS

| JP | 2003-254998 | 9/2003 |
| JP | 2004-245743 | 9/2004 |
| JP | 2005-292137 A | 10/2005 |
| JP | 2010-78572 | 4/2010 |
| JP | 2010-085170 | 4/2010 |
| JP | 2012-220344 | 11/2012 |
| JP | 2014-60116 | 4/2014 |

* cited by examiner

*Primary Examiner* — Paresh H Patel
(74) *Attorney, Agent, or Firm* — Finnegan, Henderson, Farabow, Garrett & Dunner, LLP

(57) ABSTRACT

In a battery cell unit, in which battery cells are connected in series, channels for which the battery cells are divided are sequentially connected to a capacitor, and a channel voltage is measured per the channel. For an abnormal channel whose deviation of the measured channel voltage from a reference voltage is larger than a permissible deviation value, measurement is performed by extending a charging time for charging the capacitor. For a normal channel whose deviation is equal to or smaller than the permissible deviation value, the measurement is performed by shortening the charging time for charging the capacitor so as to maintain a measurement cycle, in which the measurement on all of the channels is performed, to be constant.

8 Claims, 9 Drawing Sheets

CHART A. FIRST MEASUREMENT CYCLE Tp_1

CHART B. SECOND MEASUREMENT CYCLE Tp_2=Tp_1

CHART C. THIRD MEASUREMENT CYCLE Tp_3=Tp_1

CHART A. MEASUREMENT CYCLE Tp_1

CHART B. MEASUREMENT CYCLE Tp_2, MEASUREMENT ON $Ch_1$

CHART C. MEASUREMENT CYCLE Tp_2, MEASUREMENT ON $Ch_2$

CHART D. MEASUREMENT CYCLE Tp_2, REMEASUREMENT ON $Ch_2$

CHART E. MEASUREMENT CYCLE Tp_2, MEASUREMENT ON $Ch_3$

CHART F. MEASUREMENT CYCLE Tp_2, MEASUREMENT ON $Ch_m$

VOLTAGE MEASUREMENT METHOD FOR BATTERY

INCORPORATION BY REFERENCE

The disclosure of Japanese Patent Application No. 2016-043214 filed on Mar. 7, 2016 including the specification, drawings and abstract is incorporated herein by reference in its entirety.

BACKGROUND

1. Technical Field

The disclosure relates to a voltage measurement method for a battery.

2. Description of Related Art

A voltage measurement method for a battery cell by a so-called flying capacitor method is disclosed in Japanese Patent Application Publication No. 2010-78572 (JP 2010-78572). In this voltage measurement method, when a measured voltage is lower than a specified value, a charging time for charging a capacitor is changed to be extended, and the voltage of the battery cell is measured again. In this way, malfunction of the battery cell and malfunction of a connection circuit such as an increase in contact resistance are separately determined.

SUMMARY

However, there is such a problem that, in the cases where the charging time is changed to be extended and the voltage is measured again, a measurement time for all of the battery cells is also extended, and thus a measurement cycle of each of the battery cells has to be changed. Such a problem not only occurs in a case where the voltage of the individual battery cell is measured but also occurs in a case where each channel includes one or more battery cells and a voltage of the individual channel is measured.

The disclosure provides a voltage measurement method, which will be described below.

(1) An aspect of the disclosure is a voltage measurement method of sequentially connecting in channels, m being an integer equal to or smaller than n, for which n battery cells are divided, in a battery cell unit, in which the n battery cells, n being an integer equal to or larger than two, are connected in series, to a capacitor via a connection circuit and measuring a channel voltage per the channel. A deviation of the measured channel voltage from a reference voltage is compared with a permissible deviation value. For an abnormal channel whose deviation of the measured channel voltage from the reference voltage is larger than the permissible deviation value, measurement is performed by extending a charging time for charging the capacitor. For a normal channel whose deviation is equal to or smaller than the permissible deviation value, the measurement is performed by shortening the charging time for charging the capacitor so as to maintain a measurement cycle, in which the measurement on all of the channels is performed, to be constant. According to the aspect of the disclosure, for the abnormal channel whose deviation of the measured channel voltage is larger than the permissible deviation value, the next measurement is performed by extending the charging time. In addition, the charging time of the normal channel is shortened. Thus, the measurement cycle can be maintained to be constant. Meanwhile, when contact resistance is increased, the channel voltage can be measured again.

In the above aspect, in a case where the abnormal channel exists among the channels on which the measurement is performed in a certain measurement cycle, the charging time during the measurement on the abnormal channel may be extended in a next measurement cycle, and the charging time during the measurement on the normal channel may be shortened in the next measurement cycle. According to this aspect, while the measurement on all of the channels is performed per measurement cycle, the charging time of the abnormal channel is extended, and the charging time of the normal channel is shortened in a next charging cycle. Thus, the measurement cycle can be maintained to be constant. Meanwhile, when the contact resistance is increased, the channel voltage can be measured again.

In the above aspect, in a case where the channel on which the measurement is performed in a certain measurement cycle is the abnormal channel, the charging time of the abnormal channel may be extended to perform remeasurement on the abnormal channel in the same measurement cycle, and the charging time of the normal channel on which the measurement is performed after the abnormal channel may be shortened in the same measurement cycle. According to this aspect, the charging time of the channel as the abnormal channel is extended, and the charging time of the normal channel, on which the measurement is performed thereafter, is shortened in the same measurement cycle. Thus, the measurement cycle can be maintained to be constant. Meanwhile, when the contact resistance is increased, the channel voltage can be measured again.

In the above aspect, the measurement cycle may be divided into two periods of a measurement period in which the measurement on the m channels is performed and a non-measurement period that follows. the measurement period, and the measurement period may be maintained to be constant. According to this aspect, the measurement period in which the measurement on all of the channels is actually performed is maintained to be constant. Thus, the measurement cycle can be maintained to be constant, and control thereof is further facilitated.

In the above aspect, the reference voltage may be an average voltage of the channel voltages that are measured from a plurality of the channels.

In the above aspect, when the charging time of the normal channel is shortened, a plurality of the charging times of the normal channels may equally be shortened.

In the above aspect, the charging times of all of the channels may be set to a reference charging time when voltage measurement in the next measurement cycle is started from a certain measurement cycle.

In the above aspect, an extended charging time of the abnormal channel may be compared with a specified upper limit charging time. In a case where the extended charging time exceeds the upper limit charging time, the abnormal channel may be determined as a malfunctioning channel, The disclosure can be realized in various modes, for example, a voltage measurement method, a voltage measurement device, and a control method for a voltage measurement device.

BRIEF DESCRIPTION OF THE DRAWINGS

Features, advantages, and technical and industrial significance of exemplary embodiments will he described below with reference to the accompanying drawings, in which like numerals denote like elements, and wherein.

DETAILED DESCRIPTION OF EMBODIMENTS

A. First Embodiment

Figure 1:
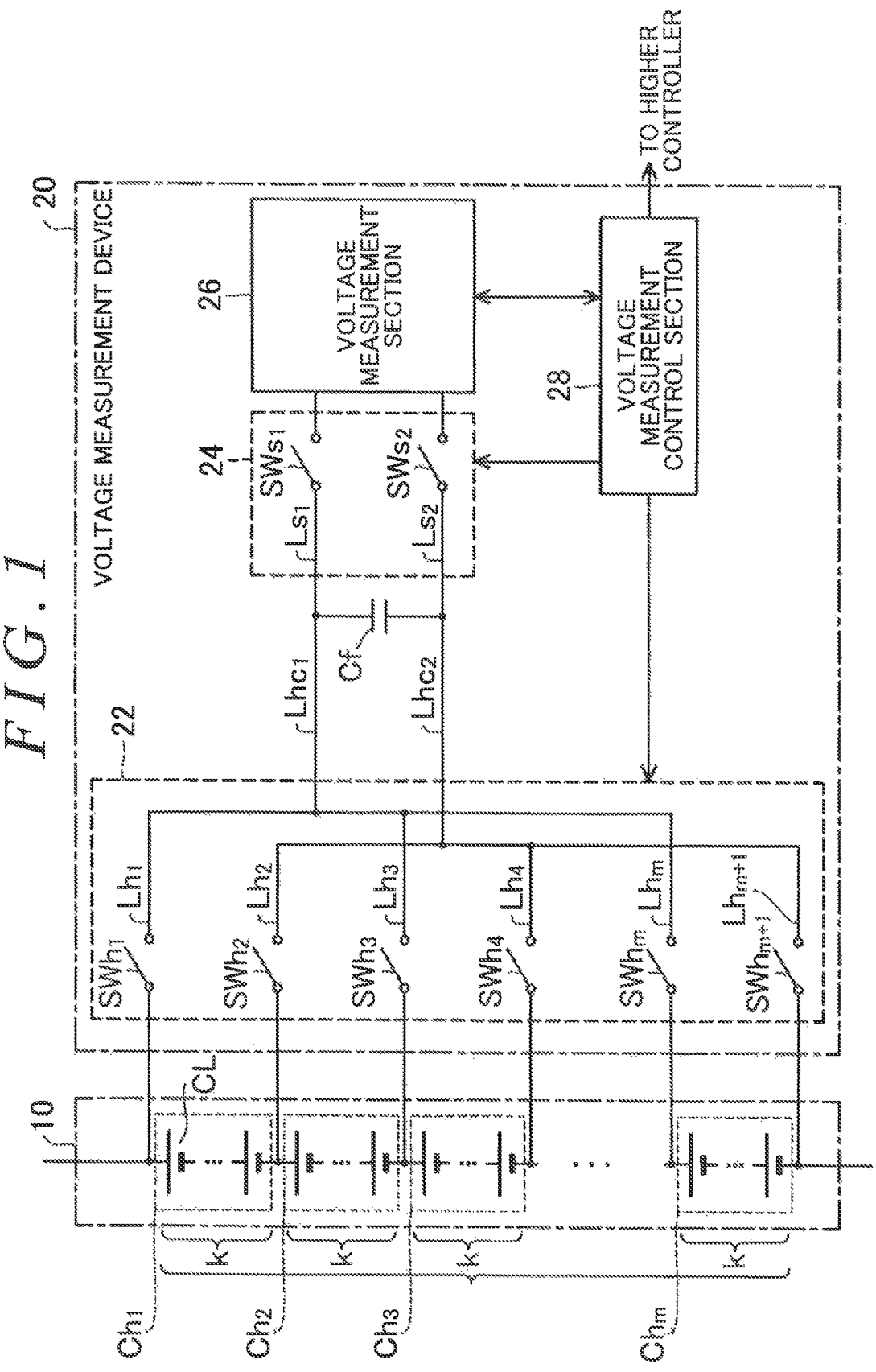
FIG. 1 is an explanatory view of a configuration of a voltage measurement device that executes a voltage measurement method of a first embodiment.

FIG. 1 is an explanatory view of a configuration of a voltage measurement device 20 that executes a voltage measurement method of a first embodiment. A battery cell unit 10 as a measurement target of the voltage measurement device 20 is a battery, such as a secondary battery or a fuel battery, that is configured by connecting n (n is an integer equal to or larger than two) battery cells CL in series. The voltage measurement device 20 is a voltage measurement device that divides the a battery cells CL into m (m is an integer equal to or smaller than n) channels Ch and measures a voltage per channel Ch. The one channel Ch is configured by including k (k is an integer expressed by n/m) battery cells CL. However, when n=m, k=1, and the one channel Ch is equivalent of the one battery cell. Note that, when the channels Ch are distinguished below, the channels Ch are denoted by "$Ch_1$", "$Ch_2$", "$Ch_3$", ..., "$Ch_m$" with numbers being indices in an order of alignment with one end side (an upper side in FIG. 1) of series connection being the first. When the channels Ch are not distinguished below, the channels Ch are simply denoted by "Ch".

The voltage measurement device 20 includes a first switch circuit 22, a capacitor Cf, a second switch circuit 24, a voltage measurement section 26, and a voltage measurement control section 28.

The first switch circuit 22 is a circuit functioning as a sampling switch that switches between connection (ON) and disconnection (OFF) between the channel Ch as the measurement target of the channels $Ch_1$ to $Ch_m$ and the capacitor Cf as a flying capacitor to sample a channel voltage of the channel Ch as the measurement target.

The first switch circuit 22 includes: odd-number side channel lines $Lil_1$, $Lh_3$, ..., each of which has one end being connected to a terminal of a positive electrode of each of the odd-numbered $Ch_1$, $Ch_3$, ... (or a negative electrode of each of the even-numbered channels $Ch_2$, $Ch_4$, ... ); and an odd-number side common line $Lhc_1$, to which the other ends of the odd-number side channel lines $Lh_1$, $Lh_3$, ..., are connected, and which is connected to one end of the capacitor Cf. The first switch circuit 22 also includes: even-number side channel lines $Lh_2$, $Lh_4$, ..., each of which has one end being connected to a terminal of a positive electrode of each of the even-numbered channels $Ch_2$, $Ch_4$, ... (or a negative electrode of each of the odd-numbered channels $Ch_1$, $Ch_3$, ... ); and an even-number side common line $Lhc_2$, to which the other ends of the even-number side channel lines $Lh_2$, $Lh_4$, ... are connected and which is connected to the other end of the capacitor Cf. The first switch circuit 22 further has channel switches $SWh_1$, $SWh_2$, $SWh_3$, $SWh_4$, ... that are respectively provided on the channel lines $Lh_1$, $Lh_2$, $Lh_3$, $Lh_4$, .... Here, indices following "Lh" of the channel lines and "SWh" of the channel switches respectively correspond to the indices of the channels Ch, to which the positive electrodes are respectively connected. Note that the m+1st channel line $Lh_{m+1}$ is connected to the negative electrode of the m-th channel $Ch_m$, and the m+1st channel switch $SWh_{m+1}$ is provided on this channel line $Lh_{m+1}$. Accordingly, the m+1 channel lines Lh and the m+1. channel switches SWh are provided for the m channels $Ch_1$ to $Ch_m$. Note that m is an odd number in FIG. 1, the m-th channel line $Lh_m$ is connected as the odd-number side channel line to the odd-number side common line $Lhc_1$, and the m+1st channel line $Lh_{m+1}$ is connected to the even-number side common line $Lhc_2$. Here, m is an even number, the m-th channel line $Lh_m$ may be connected as the even-number side channel line to the even-number side common line $Lhc_2$, and the m+1st channel line $Lh_{m+1}$ may be connected to the odd-number side common line $Lhc_1$.

The first switch circuit 22 connects the channel Ch as the measurement target of the channels $Ch_1$ to $Ch_m$ in parallel to the capacitor Cf by switching between ON and OFF of the channel switches $SWh_1$ to $SWh_{m+1}$. For example, when the first channel $Ch_1$ is set as the measurement target, the first and second channel switches $SWh_1$, $SWh_2$ are turned ON, and the other channel switches $SWh_3$ to $SWh_{m+1}$ are turned OFF. In addition, when the second channel $Ch_2$ is set as the measurement target, the second and third channel switches $SWh_2$, $SWh_3$ are turned ON, and the other channel switches $SWh_1$, $SWh_4$ to $SWh_{m+1}$ are turned OFF. Note that positive polarity and negative polarity of both of the terminals of the capacitor Cf in a case where the even-numbered channels $Ch_2$, $Ch_4$, ..., are connected to the capacitor Cf are reversed from a case where the odd-numbered channels $Ch_1$, $Ch_3$, ... are connected to the capacitor Cf.

The second switch circuit 24 is a circuit functioning as a transfer switch that transfers a voltage between both of the terminals of the capacitor Cf to the voltage measurement section 26 by respectively switching connection (ON) and disconnection. (OFF) between the terminals of the capacitor Cf and two input terminals of the voltage measurement section 26.

The second switch circuit 24 has: a first transfer line Ls that connects between one terminal of the capacitor Cf connected to the odd-number side common line $Lhc_1$ and one input terminal of the voltage measurement section 26; and a first transfer switch $SWs_1$ that is provided on the first transfer line $Ls_1$. The second switch circuit 24 also has: a second transfer line $Ls_2$ that connects between the other terminal of the capacitor Cf connected to the even-number side common line $Lhc_2$ and the other input terminal of the voltage measurement section 26; and a second transfer switch $SWs_2$ that is provided on the second transfer line $Ls_2$. The second switch circuit 24 connects the capacitor Cf and the voltage measurement section 26 by turning ON the first and second transfer switches $SWs_1$, $SWs_2$, and disconnects the capacitor Cf from the voltage measurement section 26 by turning OFF the first and second transfer switches $SWs_1$, $SWs_2$.

The voltage measurement section 26 measures the voltage between both of the terminals of the capacitor Cf and outputs the measured voltage as a voltage value of the channel voltage of the channel Ch as the measurement target to the voltage measurement control section 28. As the voltage measurement section 26, for example, any of various general voltage measurement circuits, such as a voltage, measurement circuit, that amplifies the voltage of the capacitor Cf by an amplifier, converts the amplified voltage to a digital value by an AD converter, and outputs the digital value can be used.

The voltage measurement control section 28 controls operations of the first switch circuit 22, the second switch circuit 24, and the voltage measurement section 26, repeatedly measures the channel voltages of the channels $Ch_1$ to $Ch_m$ per constant control cycle (hereinafter also referred to as a "measurement cycle"), and outputs measurement results to a higher controller. The voltage measurement control section 28 is constructed of a computer that has a CPU, ROM, RAM, an interface, and the like, which are not shown, and executes the above control by executing a control program that is stored in the ROM in advance.

The voltage measurement device 20 measures the voltage of the battery cell unit 10 per channel Ch and monitors presence or absence of malfunction per channel Ch. Note that the number of the battery cells CL that are included in the one channel Ch is preferably equal to or larger than two This is because, when the voltage is measured per battery cell CL, a large number of the connection lines and the connection switches to the capacitor Cf as the flying capacitor are required, this results in enlargement of the device, and a time required for the single measurement of all of the battery cells CL is extended in accordance with the number of the battery cells CL in view of this, the voltage is measured per channel Ch that includes the plural battery cells CL. In this way, the number of the connection lines and the connection switches is reduced, this realizes downsizing of the device, and the time required for the single measurement of all of the battery cells CL can he shortened.

Figure 2:
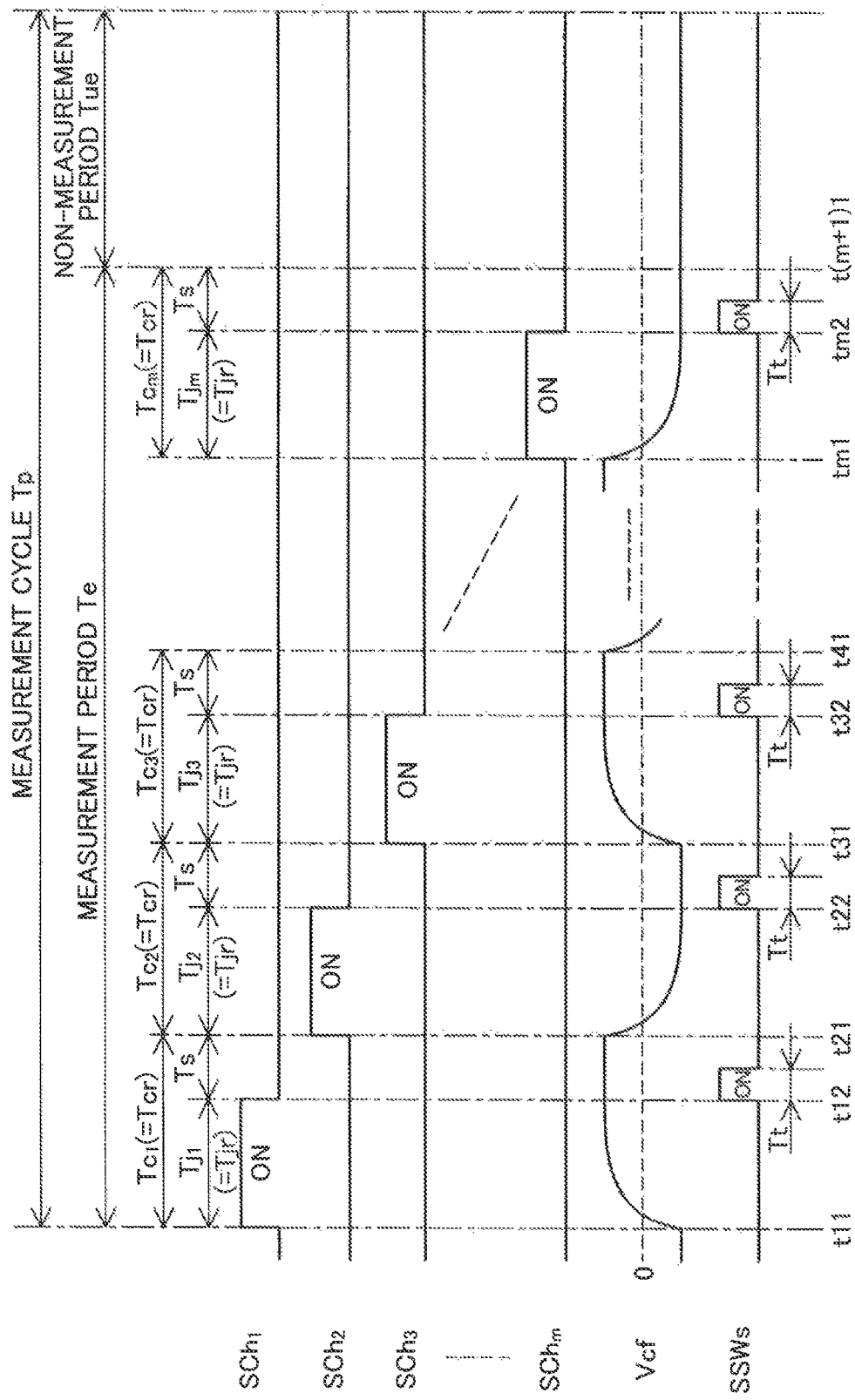
FIG. 2 is a timing chart that shows a basic operation of measurement per channel by the voltage measurement device.

FIG. 2 is a timing chart of a basic operation of the measurement per channel Ch by the voltage measurement device 20. The measurement on channels $Ch_1$ to $Ch_m$ is performed per constant measurement cycle Tp. The measurement cycle Tp is divided into: a measurement period Te in which the measurement from the first channel $Ch_1$ to the m-th channel $Ch_m$ is sequentially performed; and a non-measurement period Tue which is a period until the next measurement cycle Tp and in which the measurement is not performed. Here, the non-measurement period Tue can he omitted. In the measurement period Te, the measurement on each of the channels is sequentially performed from a first channel cycle $Tc_1$ to an m-th channel cycle $Tc_m$. In the basic operation, each of the channel cycles $Tc_1$ to $Te_m$ is set as a reference channel cycle Tcr that is obtained by equally dividing the measurement period Te by the number m of the channels. The channel cycles $Tc_1$ to $Tc_m$ are respectively divided into charging times $Tj_1$ to $Tj_m$ of the channels and a measurement time Ts that is common to the channels. As will be described below, each of the charging times $Tj_1$ to $Tj_m$ is a period in which electric charges corresponding to an output voltage of the corresponding one of the channels $Ch_1$ to $Ch_m$ (hereinafter also referred to as the "channel, voltage") are stored in the capacitor Cf (FIG. 1) and the channel voltage is thereby sampled. Each of the measurement times Ts is a period in which the channel voltage that is sampled in each of the charging times $Tj_1$ to $Tj_m$ is transmitted to the voltage measurement section 26 (FIG. 1) for the measurement.

Switch timing waveforms $SCh_1$ to $SCh_m$ in FIG. 2 respectively indicate the charging times to Ti in which the channels $Ch_1$ to $Ch_m$ are connected (ON) to the capacitor Cf. More specifically, a period in which the first switch timing waveform $SCh_1$ is ON is a period in which the channel switches $SWh_1$, $SWh_2$ (FIG. 1) are ON, a period in which the second switch timing waveform $SCh_2$ is ON is a period in which the channel switches $SWh_2$, $SWh_3$ are ON, a period in which the third switch timing waveform $SCh_3$ is ON is a period in which the channel switches $SWh_3$, $SWh_4$ are ON, and a period in which the m-th switch timing waveform $SCh_m$ is ON is a period in which the channel switches $SWh_m$, $SWh_{m+1}$ are ON. The charging time Tj is a charging time that is required to store the electric, charges corresponding to the channel voltage in the capacitor Cf in order to sample the channel voltage of the channel Ch that is connected to the capacitor Cf The charging time Tj is usually set as a sufficiently longer time than a charging required time (for example, 3RC) that is determined on the basis of: a time constant RC that corresponds to a standard value R of resistance (hereinafter simply referred to as "contact resistance") and a capacity value C of the capacitor Cf, and the resistance includes the contact resistance between the terminal of the channel Ch and the channel line Lh, wiring resistance of the channel line Lh, on-resistance of the channel switch SWh, and the like. Note that, in this example, each of the charging times $Tj_1$ to $Tj_m$ is set to a reference charging time Tjr in the basic operation.

A voltage waveform Vcf in FIG. 2 indicates an interterminal voltage of the capacitor Cf (FIG. 1). A switch timing waveform SSWs in FIG. 2 indicates a transfer period Tt in which the transfer switches $SWs_1$, $SWs_2$ (FIG. 1) are turned ON in the measurement time Ts and the intra-terminal voltage Vcf of the capacitor Cf is transmitted to the voltage measurement section 26. The transfer period Tt is set as a time in which the inter-terminal voltage Vcf of the capacitor Cf is transmitted to the voltage measurement section 26 and the voltage measurement section 26 can measure the inter-terminal voltage Vcf. Accordingly, the transfer period Tt depends on a response time of the transfer switch SWs and an operation speed of a circuit that constitutes the voltage measurement section 26. In addition, a period after a lapse of the transfer period Tt in the measurement time Ts is a transitional period that is set in consideration of the response time of shutdown of the transfer switch SWs. Note that each of the transfer period Tt and the measurement time Ts is usually a sufficiently shorter time than the charging time Tj; however, each of the transfer period Tt and the measurement time Ts is shown in an exaggerated manner for ease of illustration. The same applies to the following drawings.

In the first channel cycle $Tc_1$, the connection of the first channel $Ch_1$ to the capacitor Cf is turned ON, and the electric charges that correspond to the channel voltage are stored in the capacitor Cf from the first channel $Ch_1$ in the first charging time $Tj_1$ that starts from start timing t11 of the channel cycle. As a result of this, the inter-terminal voltage Vcf of the capacitor Cf is increased in a positive direction (in FIG. 1, a direction in which the odd-number side common line $Lhc_1$ side is + and the even-number side common line $Lhc_2$ is − is set to be positive), and the channel voltage of the first channel $Ch_1$ is generated.

At termination timing t12 of the first charging time $Tj_1$, the connection of the first channel $Ch_1$ to the capacitor Cf is turned OFF, and the channel voltage of the first channel $Ch_1$ is retained in the capacitor Cf. In addition, as indicated by the switch timing waveform SSWs, the transfer switch SWs is turned ON at this termination timing t12. In this way, in the transfer period Tt, the channel voltage of the first channel $Ch_1$ that is retained in the capacitor Cf is transmitted, and the channel voltage is measured.

In the second channel cycle $Tc_2$, as indicated by the second switch timing waveform $SCh_2$, the connection of the second channel $Ch_2$ to the capacitor Cf is turned ON, and, similar to the first channel $Ch_1$, the channel voltage of the second channel $Ch_2$ is measured in a second sampling cycle $Tj_2$ that starts at start time t21 of the channel cycle. However, as described above, the second channel $Ch_2$ is connected to the capacitor Cf in a manner that the positive polarity and the negative polarity thereof are reversed from those of the first channel $Ch_1$. Thus, positive polarity and negative polarity related to the inter-terminal voltage Vcf that corresponds to the second channel $Ch_2$ are reversed from those in a case of the first channel $Ch_1$.

Thereafter, in the third channel cycle $Tc_3$ to the m-th channel cycle $Tc_m$, the channel voltages of the corresponding channels $Ch_3$, $Ch_5$, . . . are measured in the similar manner to the first channel cycle $Tc_1$ in the odd-numbered channel cycles $Tc_3$, $Tc_5$, . . . , and the channel voltages of the corresponding channels $Ch_4$, $Ch_6$, . . . are measured in the similar manner to the second channel cycle $Tc_2$ in the even-numbered channel cycles $Tc_4$, $Tc_6$, . . . .

Figure 3:
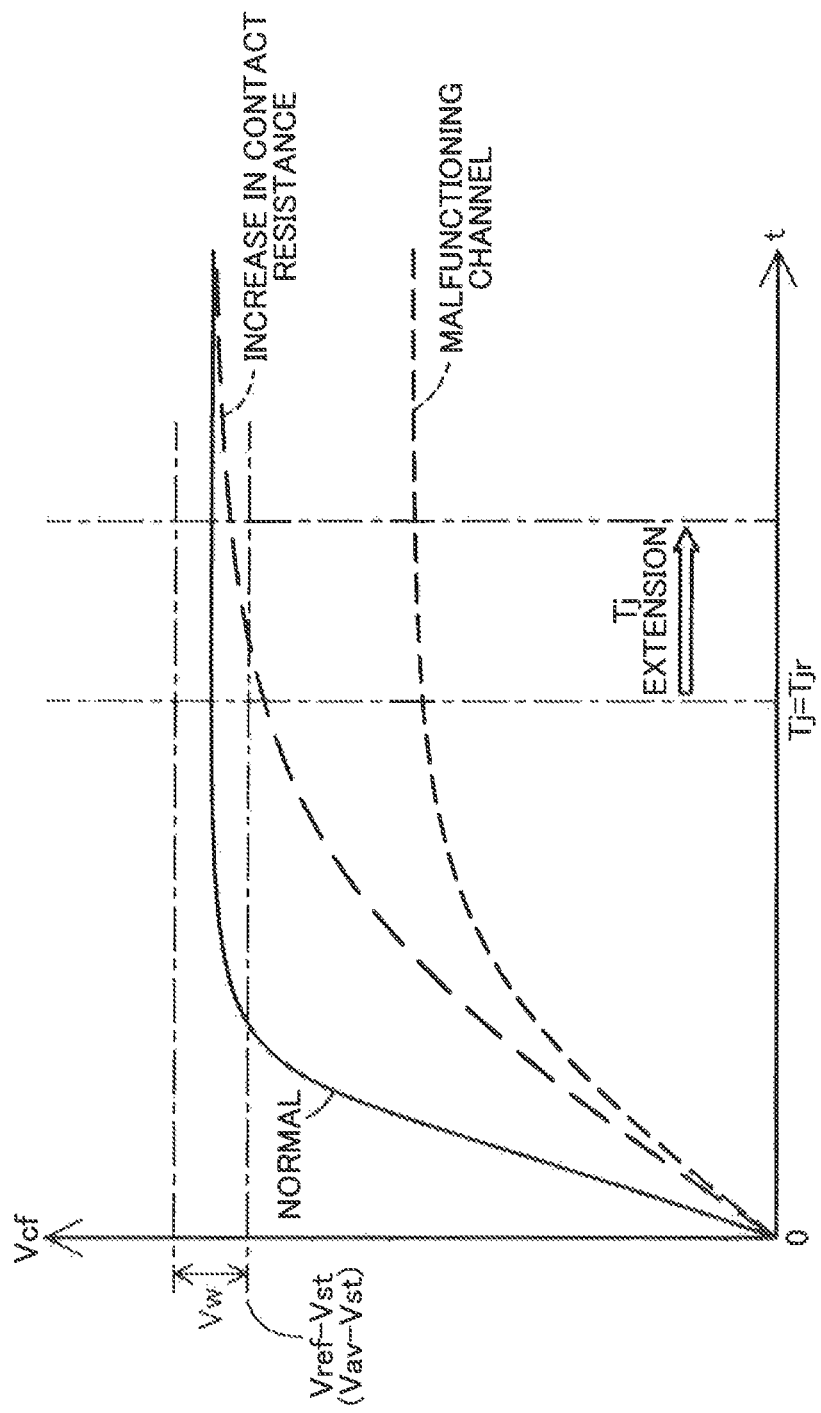
FIG. 3 is an explanatory chart of a channel voltage measured in a basic voltage control operation.

FIG. 3 is an explanatory chart of the channel voltage measured in a basic voltage control operation. In FIG. 3, the channel voltage is shown by a graph that has time t as a horizontal axis and the inter-terminal voltage Vcf of the capacitor Cf as a vertical axis. Here, the positive polarity and the negative polarity related to the inter-terminal voltage Vcf are reversed in accordance with whether the channel is one of the odd-numbered channels $Ch_1$, $Ch_3$, . . . or one of the even-numbered channels $Ch_2$, $Ch_4$, . . . . Thus, the channel voltage is shown as an absolute'Value by ignoring the reference numeral.

At time when the normal reference charging time Tj (=Tjr) elapses, the inter-terminal voltage Vcf of a case where the channel Ch is normal becomes a voltage that falls within a normal voltage range Vw. On the other hand, the inter-terminal voltage Vcf of a case where the channel Ch itself malfunctions and thus is a malfunctioning channel becomes a lower voltage than a lower limit of the voltage range Vw. Note that a state where the channel Ch malfunctions means a state where at least one of the battery cells CL included in the channel Ch malfunctions. In addition, the inter-terminal voltage Vcf of a case where the channel Ch is normal but is a contact resistance increasing channel whose contact resistance is increased possibly becomes the lower voltage than the lower limit of the normal voltage range Vw. This is because there is a case where charging response to the capacitor Cf is delayed in accordance with an increased amount of the contact resistance and thus the channel voltage does not reach the voltage at the lower limit of the normal voltage range Vw when the reference charging time Tjr elapses. Note that the normal voltage of the battery cell CL, changes depending on a charging state or a temperature thereof. Accordingly, the normal voltage range Vw of the channel Ch is, for example, determined from an average voltage Vav of the plural channels $Ch_1$ to $Ch_m$. In this case, the lower limit of the normal voltage range Vw is set at a value Vav−Vst that is obtained by subtracting a preset permissible deviation value Vst from the average voltage Vav of the plural channels $Ch_1$ to $Ch_m$.

The case where the inter-terminal voltage Vcf is lower than the lower limit of the normal voltage range Vw when the reference charging time Tjr elapses includes the case where the channel Ch itself malfunctions and thus is the malfunctioning channel and the case where the channel Ch is the contact resistance increasing channel whose contact resistance is increased. In this case, malfunctioning of the channel Ch itself cannot be distinguished. As a method for distinguishing such malfunctioning of the channel Ch itself, it is considered to extend the charging time Tj to be longer than the reference charging time Tjr. Lowering of the inter-terminal voltage Vcf, which is caused by shortage of the charging time, can be canceled by extending the charging time Tj. Thus, in the case of the contact resistance increasing channel, the inter-terminal voltage Vcf can be measured as the voltage within the normal voltage range Vw. In the case where the inter-terminal voltage Vcf does not become the voltage within the normal voltage range Vw even after the charging time Tj is extended, it can be considered that the channel Ch itself malfunctions and thus is the malfunctioning channel. In other words, the malfunction of the channel Ch can be distinguished by extending the charging time Tj to be the longer time than the reference charging time Tjr for the measurement. For this purpose, a description will hereinafter be made on a voltage measurement control operation that includes malfunction detection control for which the method for extending the charging time Tj is used.

Figure 4:
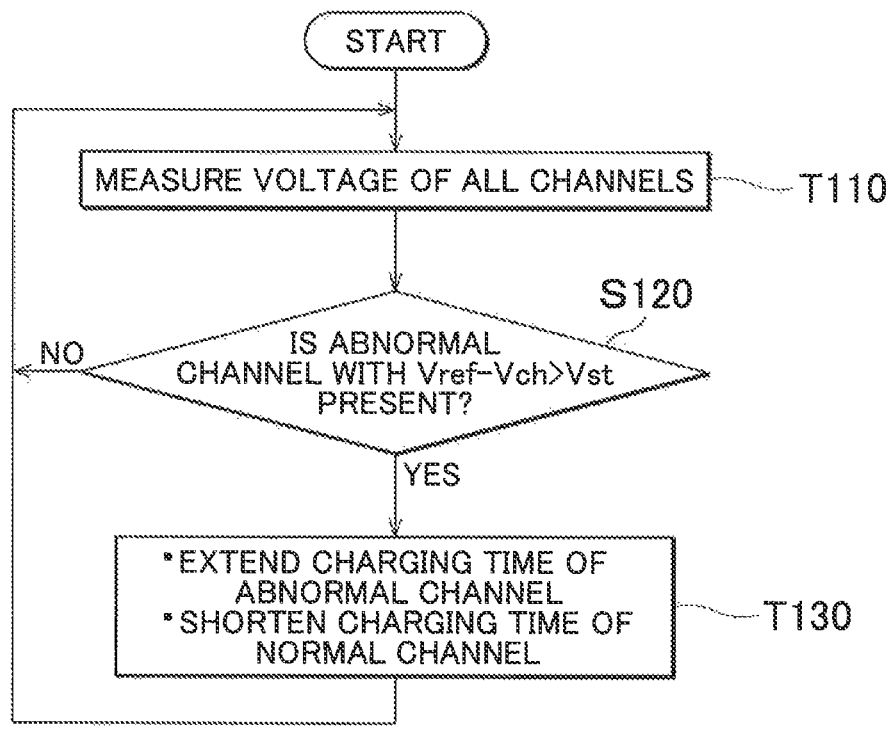
FIG. 4 is a flowchart of a procedure of voltage measurement control processing in the first embodiment.

FIG. 4 is a flowchart of a procedure of voltage measurement control processing in the first embodiment. Here, a channel in which a deviation between a reference voltage Vref and a measured channel voltage Vch (Vref−Vch) is equal to or lower than the permissible deviation value Vst is set as a normal channel, and a channel in which the deviation therebetween is larger than the permissible deviation value Vst is set as an abnormal channel. This corresponds to a case where the lower limit of the normal voltage range Vw is set to (Vref−Vst) in FIG. 3. Note that the average voltage Vav of the plural channels or all of the channels may be used as the reference voltage Vref, or a reference voltage other than the average voltage Vav, such as a standard channel voltage that corresponds to SOC (remaining charging capacity) and a temperature of the battery cell unit 10 may be used as the reference voltage Vref In the latter case, a relationship among the SOC and the temperature of the battery cell unit 10 and the standard channel voltage is preferably stored in advance in a mode of a map or a lookup table in non-volatile memory of the voltage measurement device 20.

The voltage measurement control section 28 measures the voltages of all of the channels in the set charging time Tj in step T110, and determines in step T120 whether the abnormal channel with Vref−Vch>Vst is present. If the abnormal channel is absent, the processing returns to step T110, and the voltages of all of the channels Ch are measured in the next measurement cycle Tp (FIG. 2). On the other hand, if the abnormal channel is present, the charging time Tj for the abnormal channel is extended, and the charging time Tj for the normal time is shortened in step T130. Then, the processing returns to step T110, and the voltages of all of the channels Ch are measured in the next measurement cycle Tp. That is, while the abnormal channel is present, the voltage measurement control section 28 repeatedly extends the charging time Tj of the abnormal channel, shortens the charging time Tj of the normal channel (step T130), and measures the voltages of all of the channels Ch (step T110) per measurement cycle Tp. On the other hand, in the case where the abnormal channel is absent, the voltage measurement control section 28 repeatedly measures the voltages of all of the channels Ch (step T110) per measurement cycle Tp. However, in the case where the charging time Tj of the one or more channels is extended to measure the voltages in the measurement cycle Tp immediately before the processing returns from step T120 to step T110, the charging time Tj may be resumed to the original reference charging time Tjr in the next measurement cycle Tp, or the charging time Tj may be maintained in an extended state. Note that, as described above, the reference charging time Tjr is set as the sufficiently longer time than the standard charging required time, and thus, the voltage of the normal channel can basically be measured as long as the charging time Tj is equal to or longer than the required charging time after being shortened from the reference charging time Tjr.

Note that length of the measurement period Te (FIG. 2), in which the voltages of all of the channels Ch are measured, may be changed in this voltage measurement control processing; however, the measurement cycle Tp, in which the voltages of all of the channels Ch are repeatedly measured, is maintained to be constant. However, maintenance of the measurement period Te to be constant is preferred in terms of such a point that the control operation is further facilitated.

Figure 5:
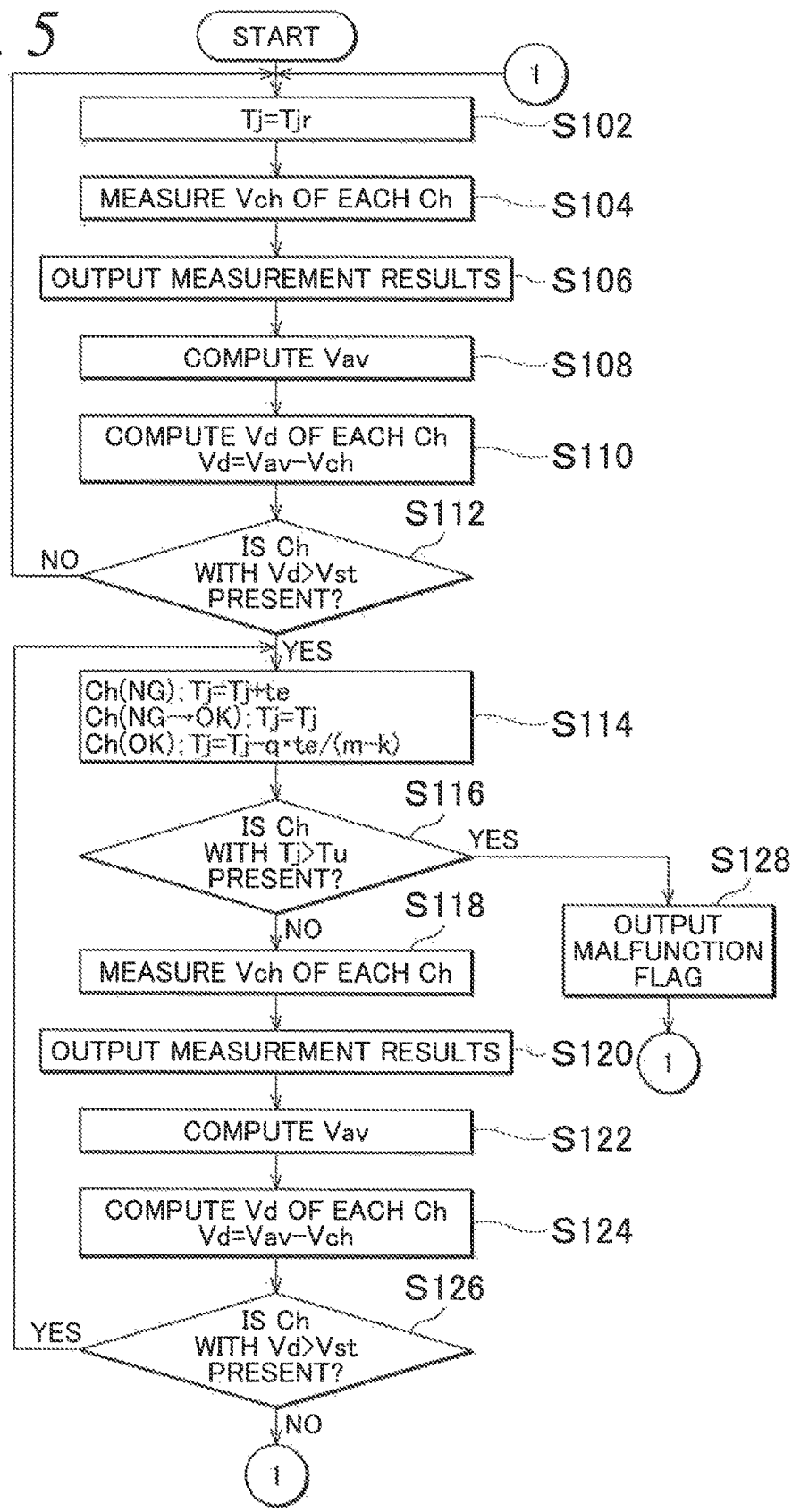
FIG. 5 is a flowchart of one example of a detailed procedure of the voltage measurement control processing explained in FIG. 4.

FIG. 5 is a flowchart of one example of a detailed procedure of the voltage measurement control processing explained in FIG. 4. The voltage measurement control section 28 first sets the charging time Tj of each of the channels Ch to the reference charging time Tjr in step S102, measures the channel voltages $Vch_1$ to $Vch_m$ of the channels $Ch_1$ to $Ch_m$ in step S104, and outputs the measurement results to the higher controller in step S106. As shown in FIG. 2, the channel voltage Vch of each of the channels Ch is measured in an order of the channel cycles $Tc_1$ to $Tc_m$ in the measurement period Te of the measurement cycle Tp.

Next, the voltage measurement control section 28 computes an average value Vav of the measured channel voltages Vch of all of the channel Ch in step S108. This average value Vav is used as the reference voltage Vref in FIG. 4. In step S110, the voltage measurement control section 28 computes a deviation Vd (=Vav−Vch) of the channel voltage Vch of each of the channels Ch from the average value Vav. Then, the voltage measurement control section 28 compares each of the deviations Vd with the permissible deviation value Vst in step S112. At this time, if the channel Ch with the larger deviation Vd than the permissible deviation value Vst is absent, that is, if all of the channels Ch are the normal channels (hereinafter also referred to as "OK channels"), the processing returns to step S102. On the other hand, if the channel Ch with the larger deviation Vd than the permissible deviation value Vst is present, the processing proceeds to step S114. The channel Ch in this case corresponds to the abnormal channel that is possibly the malfunctioning channel as the channel itself malfunctioning and the channel whose contact resistance is increased (hereinafter these will also be referred to as "NG channels").

If the processing returns from step S112 to step S102, the voltage measurement control section 28 executes the processing in step S102 to step S110 again in the next measurement cycle Tp. That is, while all of the channels Ch are the normal channels, the voltage measurement control section 28 repeatedly measures the channel voltage Vch of each of the channels Ch per measurement cycle Tp by the basic voltage measurement control operation shown in FIG. 2.

If the processing proceeds from step S112 to step S114 as a result of the measurement in a v-th measurement cycle Tp(v), the voltage measurement control section 28 extends the charging time Tj(v+1) of an NG channel Ch(NG) whose deviation Vd is larger than the permissible deviation value Vst in the v-th measurement cycle Tp(v) in accordance with the following equation (1) for the next v+1st measurement cycle Tp(v+1). In addition, the voltage measurement control section 28 sets the charging time Tj(v+1) of the OK channel whose deviation Vd is equal to or smaller than the permissible deviation value Vst in accordance with the following equation (2) or the following equation (3). That is, in the case of the channel Ch that is changed from the NG channel to the OK channel (NG→OK) in the measurement cycles Tp of v times among the OK channels, the voltage measurement control section 28 sets to maintain a charging time Tj(OK) at a time point when the NG channel is changed to the OK channel as indicated by the following equation (2). Furthermore, in the case of a channel Ch(OK) that is the OK channel throughout the measurement cycles Tp of the v times, the voltage measurement control section 28 sets to shorten the charging time Tj(v+1) as indicated by the following equation (3).

$$Ch(NG):Tj(v+1)=Tj(v)+te \quad (1)$$

$$Ch(NG \rightarrow OK):Tj(v+1)=Tj(OK) \quad (2)$$

$$Ch(OK):Tj(v+1)=Tj(v)-q \cdot te/(m-q) \quad (3)$$

Here, te is a unit extension time, q is the number of the NG channels, and m is the total number of the channels Ch. That is, [q·te] indicates a total extension time that is set in the next measurement cycle Tp in accordance with the number q of the NG channels, and [q·te/(m−q)] indicates a shortened time by which the charging time Tj for the measurement on each of the OK channels is shortened to cancel the total extension time [q·te], so as to maintain the measurement period Te (FIG. 2) of the next measurement cycle Tp to be constant.

Then, the voltage measurement control section 28 determines in step S116 whether the channel Ch with the longer charging time Tj than an upper limit charging time Tu is present. The upper limit charging time Tu is a threshold (corresponding to a "malfunction determination threshold") that distinguishes the malfunctioning channel, and is set in consideration of the charging time of the normal channel that can be shortened and a maximum extension time that is assumed in accordance with the increased amount of the contact resistance.

If the channel Ch with Tj>Tu is absent in step S116, the voltage measurement control section 28 measures the channel voltage Vch of each of the channels Ch in the next measurement cycle Tp in step S118. Here, the charging time Tj that is used for the measurement on each of the channels Ch is the charging time that is set in step S114. Then, the voltage measurement control section 28 sequentially measures the channel voltage Vch of each of the channels Ch in step S118, outputs measurement results to the higher controller in step S120, computes the average value Vav in step S122, computes the deviations Vd in step S124, and compares each of the deviations Vd with the permissible deviation value Vst in step S126. If the channel Ch with Vd>Vst is absent and all of the channels are the OK channels in step S126, the processing returns to step S102. On the other hand, if the channel Ch with Vd>Vst is present and the NO channel exists, the processing returns to step S114.

If the processing returns to step S114, the voltage measurement control section 28 executes processing for setting to extend, maintain, and shorten the charging time Tj of each of the channels Ch per measurement cycle Tp (step S114) and repeatedly measures the channel voltage Vch of each of the channels Ch (step S118) until the channel Ch with Tj>Tu is generated (step S116) or the channel Ch with Vd>Vst no longer exists (step S126). Note that the reason why the charging time Tj of the channel Ch that is changed from the NG channel to the OK channel (NG→OK) is maintained as the charging time Tj(OK) at the time when the channel Ch becomes the OK channel in step S114 is to extend the charging time Tj of each of the remaining NG channels.

If it is determined in step S112 that the channel Ch with Vd>Vst is absent during the above repetition, all of the channels Ch are measured as the normal channels. Thus, the processing returns to step S102, and the voltage measurement control section 28 returns the charging time Tj to the reference charging time Tjr and repeats the measurement on each of the channels Ch from beginning.

Here, as a case where the measured channel voltage Vch of the channel Ch falls within a normal range at a time when the charging time Tj is extended for the measurement, a case where the channel voltage Veil can be measured in the charging time that corresponds to the increase in the contact resistance by extending the time and a case where the increase in the contact resistance is canceled are considered. The case where the increase in the contact resistance is canceled can occur in a case as will be described below. More specifically, in the cases where connection stability between the terminal of the battery cell CL and the channel line Lh is low and the contact resistance is thereby likely to fluctuate, the increase in the contact resistance is possibly canceled after the contact resistance is increased. This frequently occurs, for example, in the case where the battery cell unit 10 is mounted on a mobile object, or the like. In the cases where the contact resistance is likely to fluctuate, just as described, and all of the channel voltages become the normal voltages as a result of the measurement by extending the charging time Tj of the NG channel, the charging time T of each of the channels Ch may be returned to the reference charging time Tjr in the next measurement cycle Tp. Note that there exists a case where fluctuations in the contact resistance are small and only the increase in the contact resistance caused by aging has to be considered as the increase in the contact resistance. During the above repetition, if it is determined in step S126 that the channel Ch with Vd>Vst is absent, the processing returns to step S102, and the charging time Tj is set back to the reference charging time Tjr. However, when such a case is assumed, the set charging time Tj of each of the channels Ch may be maintained.

If it is determined in step S116 that the channel Ch with Tj>Tu is present, the channel Ch is determined as the malfunctioning channel, and the voltage measurement control section 28 outputs a malfunction flag to the higher controller in step S128. The higher controller that has received the malfunction flag can detect the channel Ch with the received malfunction flag as the malfunctioning channel. Then, the voltage measurement control section 28 returns to step S102 and measures the channel voltage Volt of each of the channels Ch from beginning until receiving a stop instruction by interruption from the higher controller. Note that the voltage measurement control section 28 may stop the processing at a time point of outputting the malfunction flag.

Figure 6:
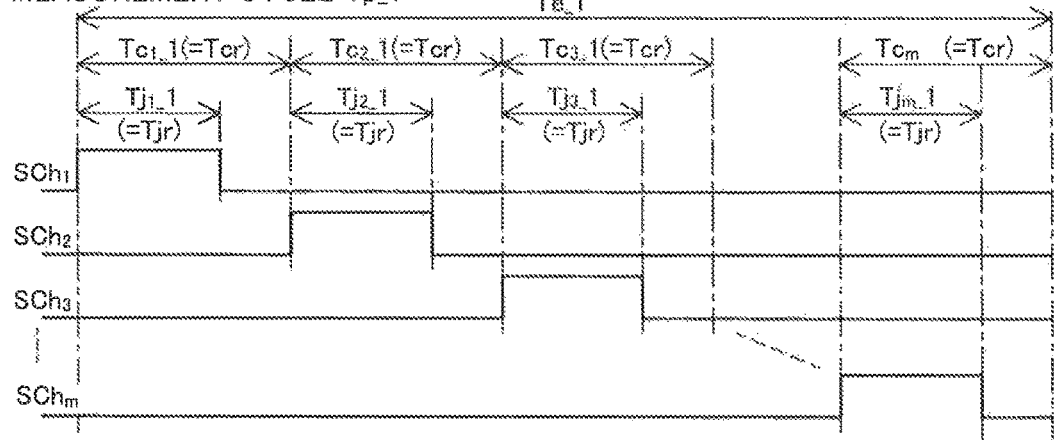
FIG. 6 includes timing charts that show one example of fluctuations in a channel cycle of each channel by the voltage measurement control processing shown in FIG. 5.
Figure 6:
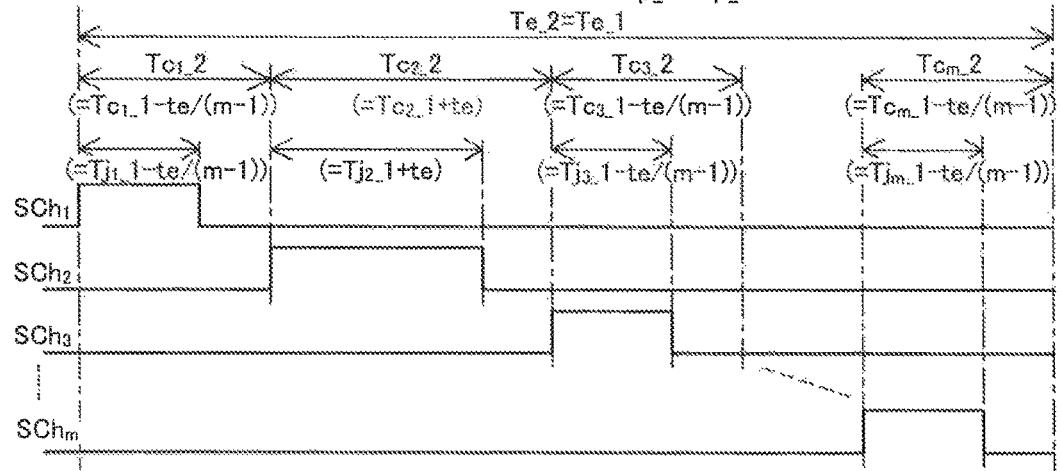
Figure 6:
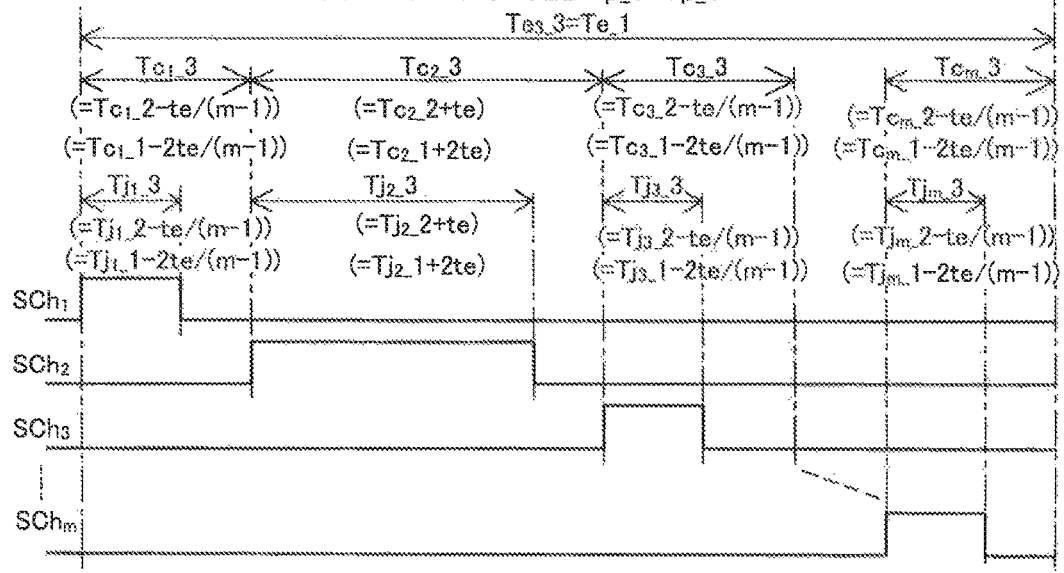

FIG. 6 includes timing charts that show one example of fluctuations in the channel cycle Tc of each of the channels Ch by the voltage measurement control processing shown in FIG. 5. Note that numbers denoted after underbars following Tp, Te, Tc, Tj are numbers indicative of orders in the measurement cycle Tp and indices indicate numbers corresponding to the channels Ch as the measurement targets. In addition, the switch timing waveforms $SCh_1$ to $SCh_m$ respectively indicate the charging times $Tj_1$ to $Tj_m$ in which the channels $Ch_1$ to $Ch_m$ are turned on for the capacitor Cf.

Similar to FIG. 2, a chart A in FIG. 6 shows a state of a basic operation where a charging time Tj_1 of each of the channels Ch is set to the reference charging time Tjr and a channel cycle Tc_1 is set to the reference channel cycle Tcr in a measurement period Te_1 of a first measurement cycle Tp_1.

It is assumed that, as a result of the measurement on each of the channels Ch in the state shown in the chart A of FIG. 6, the second channel $Ch_2$ is the NG channel. In this case, as shown in a chart B of FIG. 6, a charging time $Tj_2\_2$ and a channel cycle $Tc_2\_2$ of the second channel $Ch_2$ are each extended by the unit extension time te in a measurement period Te_2 of a second measurement cycle Tp_2. In addition, a charging time Tj__2 and a channel cycle Tc_2 of each of the other (m−1) channels Ch are each shortened by a shortened time [te/(m−1)]. However, the entire measurement period Te_2 and the entire measurement cycle Tp_2 are respectively maintained to be the same as the first measurement period Tel and the first measurement cycle Tp_1.

In the case where the second channel $Ch_2$ remains as the NG channel during the measurement in the second measurement cycle Tp_2 as shown in a chart C of FIG. 6, a charging time $Tj_2\_3$ and a channel cycle $Tc_2\_3$ of the second channel $Ch_2$ are each further extended by the unit extension time to in a measurement period Te_3 of a third measurement cycle Tp_3. That is, the charging time $Tj_2\_3$ and the channel cycle $Tc_2\_3$ of the second channel $Ch_2$ are respectively extended by twice the unit extension time te when compared to the charging time $Tj_2\_1$ and the channel cycle $Tc_2\_1$ in the first measurement cycle Tp_1. In addition, a charging time Tj_3 and a channel cycle Tc_3 of each of the other (m−1) channels Ch are each further shortened by the shortened time [te/(m−1)]. That is, the charging time Tj_3 and the channel cycle Tc_3 of each of the other (m−1) channels Ch are each shortened by twice the shortened time [te/(m−1)] when compared to the charging time Tj_1 and the channel cycle Te_1 in the first measurement cycle Tp_1. However, the entire measurement period Te_3 and the entire measurement cycle Tp_3 are respectively maintained to be the same as the first measurement period Te_1 and the first measurement cycle Tp_1.

As shown in the chart B and the chart C of FIG. 6, in the case where the NG channel is present, the charging time Tj of the NG channel is gradually extended by the unit extension time te per measurement cycle Tp for the measurement. In this way, it is possible to confirm that the battery cells CL of the channel Ch, which has become the NG channel due to the increase in the contact resistance, are normal. Then, in the case where the extended charging time Tj exceeds the upper limit charging time Tu, it is determined that the channel itself malfunctions and thus is the malfunctioning channel, and such a fact is notified to the higher controller. Accordingly, the higher controller can detect generation of the malfunctioning channel. In this way, as the cause of the NG channel, it is possible to distinguish the increase in the contact resistance and the malfunction of the battery cell CL itself from each other. Thus, measurement accuracy can be improved. In addition, excess extension of the charging time can be prevented by gradually extending the charging time Tj by the unit extension time te.

The measurement periods Te for the measurement on all of the channels Ch can be maintained to be constant, and the measurement cycle Tp can be maintained to be constant by shortening the charging time Tj and the channel cycle Tc of each of the OK channels other than the NG channel. Thus, compared to a case where the measurement cycle Tp fluctuates in accordance with fluctuations in the measurement period Te, voltage measurement control is facilitated.

Note that one example of the case where only the second channel $Ch_2$ is the NG channel has been described in the operation example shown in FIG. 6. However, in the case where the plural channels Ch are the NG channels, the charging times Tj of all of the NG channels may be extended, and the charging times Tj of the OK channels may be shortened so as to maintain the measurement period Te and the measurement cycle Tp to be constant. In addition, of the plural NG channels, the charging time Tj of the OK channel that has been changed from NG to OK is maintained. The charging times Tj of the remaining NG channels may be extended, and only the charging times Tj of the OK channels that have remained OK from beginning may be shortened.

B. Second Embodiment

Figure 7:
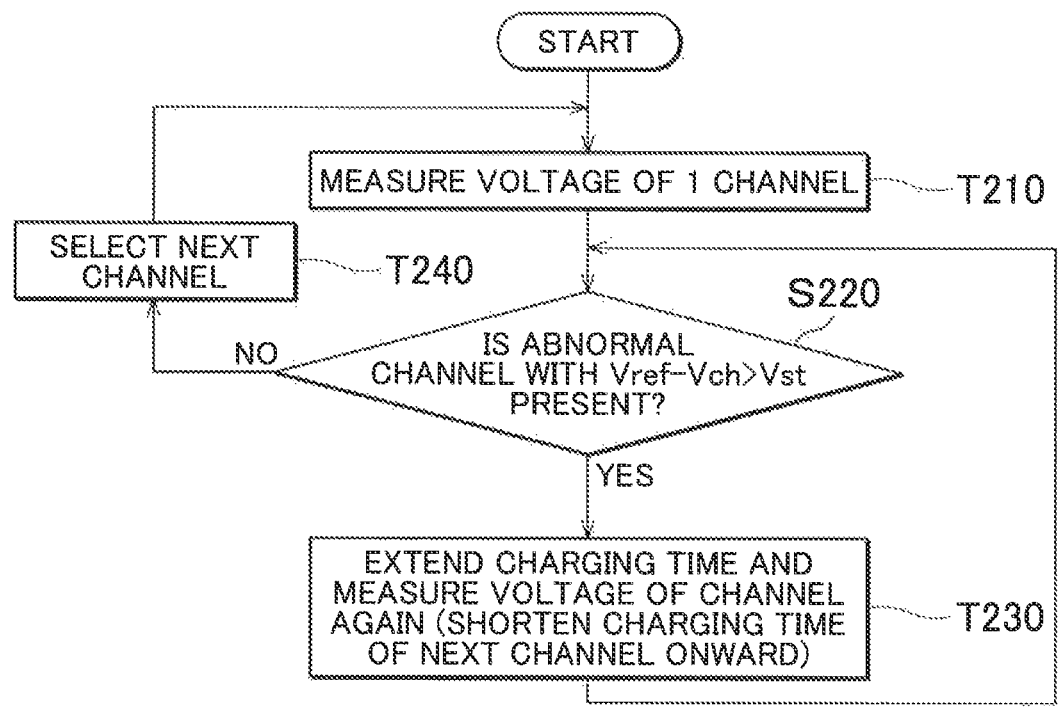
FIG. 7 is a flowchart of a procedure of voltage measurement control processing in a second embodiment.

FIG. 7 is a flowchart of a procedure of voltage measurement control processing in a second embodiment, Note that this voltage measurement control is executed by the voltage measurement control section 28 of the voltage measurement device 20 (FIG. 1) that is the same as in the first embodiment. In addition, similar to the description that has been made for FIG. 4, a channel whose deviation (Vref−Vch) is equal to or smaller than the permissible deviation value Vst is set as the normal channel, and a channel whose deviation (Vref−Vch) is larger than the permissible deviation value Vst is set as the abnormal channel.

The voltage measurement control section 28 measures the voltage of the one selected channel Ch in the set charging time Tj in step T210 and determines in step T220 whether the measured channel Ch is the abnormal channel with Vref−Vch>Vst. At this time, if the channel Ch is the abnormal channel, the charging time Tj is extended, and the voltage of the channel Ch is measured again in the same measurement cycle Tp (FIG. 2) in step T230. Note that, if this remeasurement is performed, the charging time of this channel Ch of the next time onward is shortened, On the other hand, if the channel Ch is the normal channel, the next channel Ch is selected in step T240, the processing returns to step T210, and the voltage of the selected channel Ch is measured.

Nate that, if the charging time Tj is shortened by the processing in step T230 at this time, the voltage is measured in the shortened charging time Tj in step T110. That is, the voltage measurement control section 28 repeatedly measures the voltage of the one selected channel Ch (step T210) per channel Ch while the measured channel Ch is the normal channel. On the other hand, if the measured channel Ch becomes the abnormal channel, the charging time Tj is extended, and the remeasurement on the channel Ch is repeatedly performed (step T230). Then, as for the channel Ch that has become the normal channel from the abnormal channel, the voltage of the one selected channel Ch is repeatedly measured (step T210) in the shortened charging time Tj per channel Ch.

Note that the length of the measurement period Te (FIG. 2), in which the voltages of all of the channels Ch are measured, may be changed in this voltage measurement control processing; however, the measurement cycles Tp in which the voltages of all of the channels Ch are repeatedly measured, are maintained to be constant. However, the maintenance of the measurement period Te to be constant is preferred in terms of such a point that the control operation is further facilitated.

Figure 8:
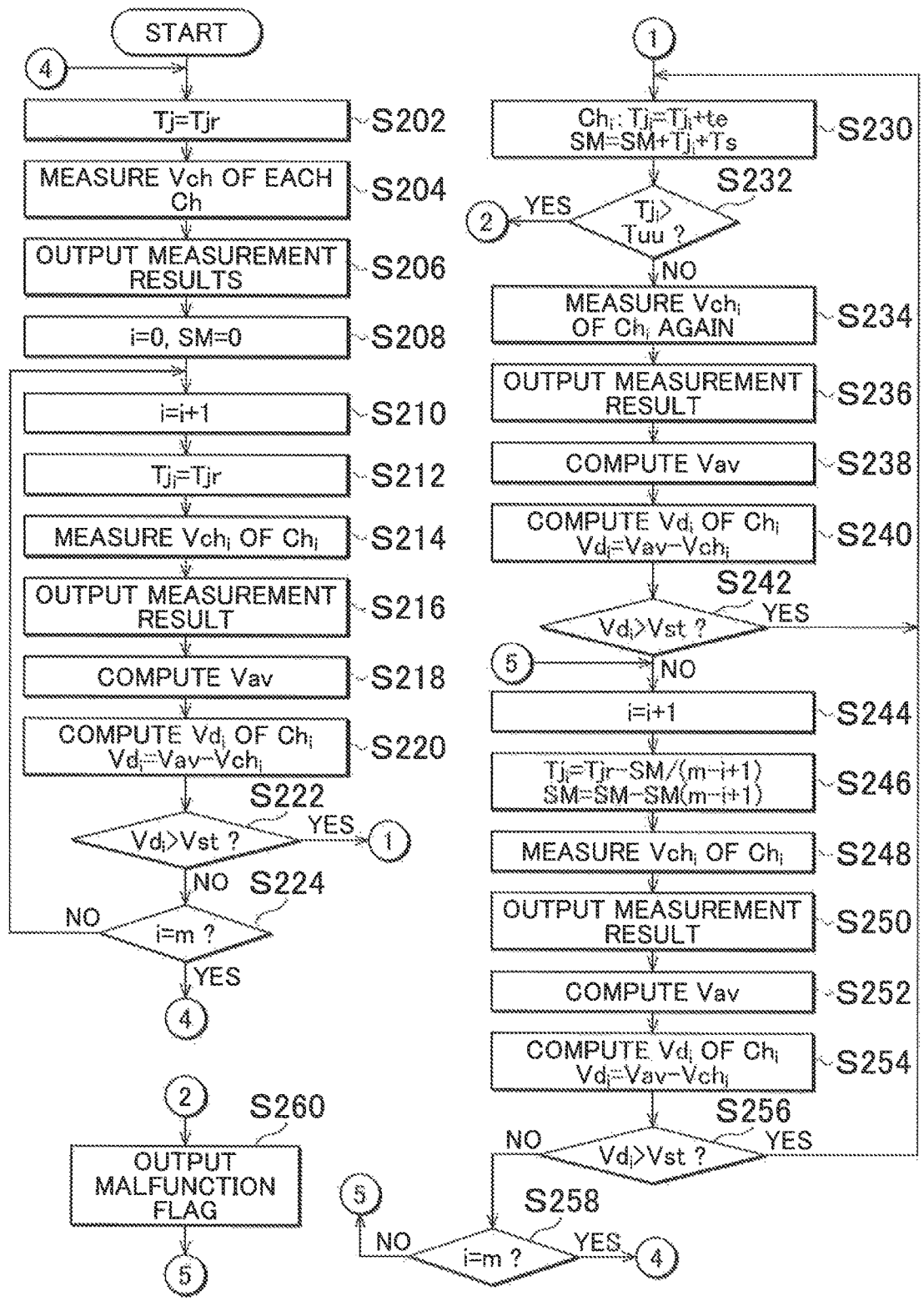
FIG. 8 is a flowchart of one example of a detailed procedure of the voltage measurement control processing explained in FIG. 7.

FIG. 8 is a flowchart of one example of a detailed procedure of the voltage measurement control processing explained in FIG. 7. Similar to steps S102 to S106 (FIG. 4) of the first embodiment, the voltage measurement control section 28 sets the charging time Tj of each of the channels Ch to the reference charging time Tjr (step S202), measures the channel voltage Vch of each of the channels Ch in the first measurement cycle Tp (step S204), and outputs measurement results to the higher controller (step S206).

Next, the voltage measurement control section 28 executes processing, which will be described below, in the second measurement cycle Tp and performs the measurement on each of the channels Ch.

First, the voltage measurement control section 28 sets a parameter i that indicates the channel Ch as the measurement target to "0", and sets a total extension time SM that indicates a total of the extension times to an initial value of "0" in step S208. Then, the voltage measurement control section 28 adds "1" to the parameter i in step S210.

Next, the voltage measurement control section 28 sets a charging time Tj of the i-th channel $Ch_1$ to the reference charging time Tjr in step S212, measures a channel voltage $Vch_i$ of the channel $Ch_i$ in step S214, and outputs a measurement result to the higher controller in step S216. Then, the voltage measurement control section 28 computes the average value Vav of the channel voltages Vch of all of the channels Ch In step S218 and computes a deviation $Vd_i$ (=Vav−$Vch_i$) of the channel voltage $Vch_i$ of the i-th channel $Ch_i$ in step S220. Note that the measurement result for the i-th channel $Ch_i$ in step S214 and the latest measurement results for the other channels that have been obtained so far are used for computation of the average value Vav. Then, the voltage measurement control section 28 compares the deviation $Vd_i$ with the permissible deviation value Vst in step S222.

If $Vd_i \leq Vst$ in step S222, that is, if the i-th channel $Ch_i$ is the normal channel (the OK channel), the processing proceeds to step S224, and the voltage measurement control section 28 repeatedly executing the processing from steps S210 to S224 until i=m is obtained. Then, if i=m is obtained and the measurement on the m-th channel $Ch_m$ is terminated, the channel voltages Vch of all of the channels Ch are measured in the second measurement cycle Tp with all of the channels Ch being the normal channels. Thus, the processing returns to step S202, and the voltage measurement control section 28 repeats the measurement on each of the channels Ch from beginning.

On the other hand, if $Vd_i > Vst$, that is, if the i-th channel $Ch_i$ is the abnormal channel (the NG channel), the processing proceeds to step S230, and the voltage measurement control section 28 extends the charging time Tj of the i-th channel $Ch_i$ to perform the remeasurement, which will be described below.

First, in step S230, the voltage measurement control section 28 extends the charging time $Tj_i$ of the i-th channel $Ch_i$ as the NO channel as indicated by the following equation (4).

$$Tj_i = Tj_i + te \quad (4)$$

In addition, the total extension time SM is increased on the basis of the charging time which is obtained by the equation (4), as indicated by the following equation (5).

$$SM = SM + Tj_i + Ts \quad (5)$$

Here, Ts is the measurement period.

Then, the voltage measurement control section 28 determines in step S232 whether the charging time $Tj_j$, which is extended in step S230, exceeds an upper limit charging time Tuu. Similar to the upper limit charging time Tu of the first embodiment, the upper limit charging time Tim is a threshold (a malfunction determination threshold) that is used to distinguish the malfunctioning channel, and is set in consideration of the charging time of the normal channel that can be shortened and the maximum extension time that is assumed in accordance with the increased amount of the contact resistance.

If Tuu in step S232, the voltage measurement control section 28 measures the channel voltage $Vch_i$ of the i-th channel $Ch_i$ in the charging time $Tj_i$, which is extended in step S230, again in step S234, and outputs a measurement result to the higher controller in step S236. Then, similar to steps S218 to S222, the voltage measurement control section 28 measures the average value Vav in step S238, computes the deviation $Vd_i$ in step S240, and compares the deviation $Vd_i$ with the permissible deviation value Vst in step S242.

If $Vd_i$>Vst in step S242, that is, the i-th channel $Ch_i$ remains as the NG channel, the processing returns to step S230, and the voltage measurement control section 28 repeatedly performs the remeasurement on the i-th channel $Ch_i$ until $Tj_i$>Tuu is obtained (step S232) or $Vd_i$≤Vst is obtained (step S242).

On the other hand, if $Vd_i$≤Vst, that is, if i-th channel $Ch_i$ becomes the

OK channel from the NG channel, the voltage measurement control section 28 adds "1" to the parameter i in step S244 and changes the measurement target to the next channel $Ch_i$.

Then, in step S246, the voltage measurement control section 28 shortens the charging time $Tj_i$ of the i-th channel $Ch_i$ as the next measurement target as indicated by the following equation (6) and reduces the total extension time SM as indicated by the following equation (7).

$$Tj_i = Tjr - SM/(m-i+1) \quad (6)$$

$$SM = SM - SM/(m-i+1) \quad (7)$$

Here, [SM/(m−i+1)] indicates a shortened time for each of the OK channels that is shortened to cancel the total extension time SM on the basis of an assumption that all of the channels Ch following the i-th channel Ch as the next measurement target are the OK channels.

Next, the voltage measurement control section 28 measures the channel voltage $Vch_i$ of the i-th channel $Ch_i$ in the charging time $Tj_i$, which is shortened in step S246, in step S248 and outputs a measurement result to the higher controller in step S250. Then, similar to steps S218 to S222, the voltage measurement control section 28 computes the average value Vav in step S252, computes the deviation $Vd_i$ in step S254, and compares the deviation $Vd_i$ with the permissible deviation value Vst in step S256, If $Vd_i$≤Vst in step S256, that is, if the i-th channel $Ch_i$ is the normal channel (the OK channel), the processing proceeds to step S258, and the voltage measurement control section 28 repeatedly executes processing from steps S244 to S258 until i=m is obtained. Then, if i m is obtained and the measurement on the m-th channel $Ch_m$ is terminated, the channel voltages Vch of all of the channels Ch are measured in the second measurement cycle Tp. Thus, the processing returns to step S202, and the voltage measurement control section 28 repeats the measurement on each of the channels Ch from beginning. Note that the processing may return to step S208.

On the other hand, if $Vd_i$>Vst, that is, if the i-th channel $Ch_i$ is changed to the NG channel, the processing returns to step S230, and the voltage measurement control section 28 repeatedly performs the remeasurement on the i-th channel $Ch_i$ until $Tj_i$>Tuu is obtained (step S232) or $Vd_i$≤Vst is obtained (step S242).

If it is determined in step S232 that $Tj_i$>Tuu, there is a possibility that the channel $Ch_i$ is the malfunctioning channel. Thus, the voltage measurement control section 28 outputs the malfunction flag to the higher controller in step S260. The higher controller that has received the malfunction flag can determine the channel $Ch_i$ with the received malfunction flag as the malfunctioning channel. Then, the processing returns to step S244, and the voltage measurement control section 28 continues the processing with the next channel Ch as the target until receiving the stop instruction by the interruption from the higher controller. Note that the processing may be stopped at a time of outputting the malfunction flag.

Figure 9:
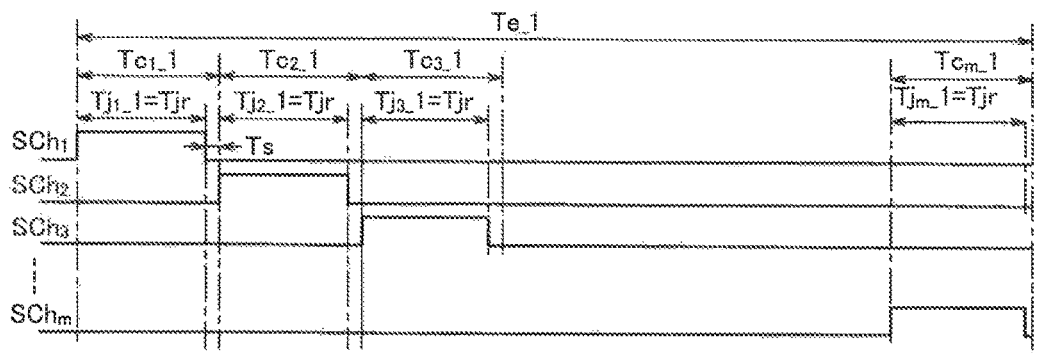
FIG. 9 includes timing charts that show one example of fluctuations in a channel cycle of each channel by the voltage measurement control processing shown in FIG. 8.
Figure 9:
Figure 9:
Figure 9:
Figure 9:
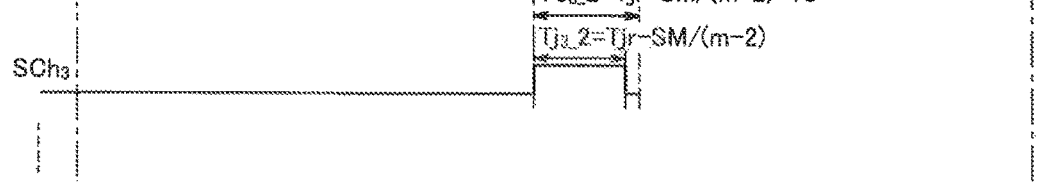
Figure 9:
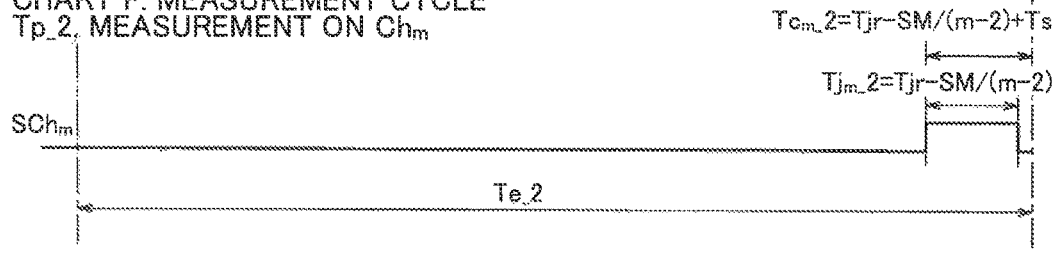

FIG. 9 includes timing charts that show one example of the fluctuations in the channel cycle Te of each of the channels Ch by the voltage measurement control processing shown in FIG. 8. Similar to FIG. 6, FIG. 9 shows one example of the case where the second channel $Ch_2$ is the NG channel. In addition, similar to FIG. 6, the numbers denoted after the underbars following Tp, Te, Te, Tj are numbers indicative of the orders in the measurement cycle Tp and the indices indicate the numbers corresponding to the channels Ch as the measurement targets. In addition, the switch timing waveforms $SCh_1$ to $SCh_m$ respectively indicate the charging times $Tj_1$ to $Ti_m$ in which the channels $Ch_1$ to $Ch_m$ are turned on for the capacitor Cf.

First, in the measurement period Te_1 of the first measurement cycle Tp_1, as indicated by the switch timing waveforms $SCh_1$ to $SCh_m$ in a chart A of FIG. 9, the measurement on the channels $Ch_1$ to $Ch_m$ is sequentially performed in channel cycles $Tc_1\_1$ to $Tc_m\_1$ that respectively include charging times $Tj\_1$ to $Tj_m\_1$ and the measurement time Ts. Note that the charging times $Tj_i\_1$ to are each set as the reference charging time Tjr.

Next, in the measurement period Te_2 of the second measurement cycle Tp_2, as will be described below, the measurement on the channels $Ch_1$ to $Ch_m$ is sequentially performed. First, as indicated by the switch timing waveform $SCh_1$ in a chart B of FIG. 9, the measurement on the first channel $Ch_i$ is performed in a channel cycle $Tc_1\_2$=Tjr+Ts of a charging time $Tj_1\_2$=Tjr. Because the first channel $Ch_1$ is the OK channel, the measurement on the next second channel $Ch_2$ is performed.

As indicated by the switch timing waveform $Sch_2$ in a chart C of FIG. 9, the measurement on the second channel $Ch_2$ is also performed in a channel cycle $Tc_2\_2$=Tjr+Ts of a charging time $Tj_2\_2$=Tjr. Because the second channel $Ch_2$ is the NG channel, the remeasurement on the second channel $Ch_2$ is performed.

As indicated by the switch timing waveform $SCh_i$ in a chart D of FIG. 9, the remeasurement on the second channel $Ch_2$ is performed by extending the charging time $Tj_2\_2$ to [Tjr+te] and extending the channel cycle $Te_2\_2$ to [Tjr+te+Ts]. In the case where the second channel $Ch_2$ remains as the NG channel during this remeasurement, the charging time $Tj_2\_2$ and the channel cycle $Tc_2\_2$ are extended again, and the remeasurement is performed. Then, as described in step S232 in FIG. 8, this remeasurement is repeatedly performed until the charging time $Tj_2$ exceeds the upper limit charging time Tuu. In the case where the charging time $Tj_2$ exceeds the upper limit charging time Tuu, the malfunction flag is output to the higher controller. Here, it is assumed that the second channel $Ch_2$ becomes the OK channel, as a result of this remeasurement, and the measurement on the next third channel $Ch_3$ is performed.

As indicated by the switch timing waveform $SCh_3$ in a chart E of FIG. 9, the measurement on the third channel $Ch_3$ is performed by shortening a charging time $Tj_3\_2$ to [Tjr−SM/(m−2)] and shortening a channel cycle $Tc_3\_2$ to [Tjr−SM/(m−2)+Ts]. If the third channel $Ch_3$ becomes the NO channel as a result of this measurement, similar to the above second channel $Ch_2$, the remeasurement on the third channel $Ch_3$ is performed by extending the charging time $Tj_3\_2$ and the channel cycle $Tc_3\_2$. Here, because the third channel $Ch_3$ is the OK channel, the measurement on the next fourth channel $Ch_4$ is performed.

In addition, because the fourth to m-th channels $Ch_4$ to $Ch_m$ are the OK channels, similar to the third channel $Ch_3$, charging times $Tj_4\_2$ to $Tj_m\_2$ and channel cycles $Tc_4\_2$ and $Tc\_2$ are shortened, and the measurement on the fourth to m-th channels $Ch_4$ to $Ch$ are sequentially performed. Note that the switch timing waveform SCh indicated by a chart F of FIG. 9 indicates a state where the charging time $Tc_m\_2$ of the m-th channel $Ch_m$ is shortened to [Tjr−SM/(m−2)] and the channel cycle $Tc\_2$ thereof is shortened ti [Tjr−SM/(m−2)+Ts]. However, in the case where the m-th channel $Ch_m$ becomes the NG channel as a result of the measurement, the charging times $Tj_4\_2$ to $Tj_m\_2$ and the channel cycles $Tc_4\_2$ and $Tc_m\_2$ of the fourth to m-th channels $Ch_4$ to $Ch_m$ are similarly extended, and the remeasurement thereof is performed.

As indicated by the chart E and the chart F of FIG. 9, in the measurement on the third to m-th channels $Ch_3$ to $Ch_m$ as the OK channels, the charging times $Tj_3\_2$ to $Tj_m\_2$ are each shortened by a shortened time [SM/(m−2)], which is obtained by equally dividing the total extension time SM by (m−2), so as to cancel the total extension time SM that is extended for the remeasurement on the second channel $Ch_2$. In this way, the second measurement period $Te\_2$ and the second measurement cycle $Tp\_2$ are respectively maintained to be the same as the first measurement period $Te\_1$ and the first measurement cycle $Tp\_1$.

As indicated by the chart D of FIG. 9, in the case where the measured channel Ch is the NG channel, the charging time Tj is gradually extended by the unit extension time te, and the remeasurement is repeatedly performed. In this way, the voltage of the channel Ch, which has become the NG channel due to the increase in the contact resistance, can be confirmed. In addition, in the case where the extended charging time Tj exceeds the upper limit charging time Tuu, it is determined that the channel Ch itself malfunctions and thus is the malfunctioning channel, and such a fact is notified to the higher controller. Accordingly, the higher controller can detect the generation of the malfunctioning channel. In this way, as the cause of the NG channel, it is possible to distinguish the increase in the contact resistance and the malfunction of the battery cell CL itself from each other. Thus, the measurement accuracy can be improved. In addition, the excess extension of the charging time can be prevented by gradually extending the charging time Tj by the unit extension time te. Furthermore, the remeasurement on the channel as the NG channel is performed. In this way, as the cause of the NG channel, the malfunction of the battery cell CL itself and malfunction of the connection circuit, which is caused by the increase in the contact resistance or the like, can preferentially be distinguished from each other.

The charging time Tj of the normal channel, which follows the channel on which the measurement is performed in the extended charging time Tj, is shortened. In this way, the measurement period Te tier the measurement on all of the channels Ch can be maintained to be constant, and the measurement cycles Tp therefore can be maintained to be constant. Thus, compared to the case where the measurement cycle Tp fluctuates in accordance with the fluctuations in the measurement period Te, the voltage measurement control is facilitated.

Note that the example of the case where only the second channel $Ch_2$ is the NG channel has been described as the operation example shown in FIG. 9. However, in the case where the plural channels are the NG channels, all of the charging times Tj of the NG channels may be extended, and the charging time Tj of the OK channel, which follows the NO channel, may be shortened so as to maintain the measurement period Te and the measurement cycle Tp to be constant.

C. Modified Examples (1) Modified Example 1

The procedure of the voltage measurement control in the above first embodiment (FIG. 4, FIG. 5) is merely one example, and the voltage measurement control is not limited to this procedure. However, it is preferred to perform the measurement on all of the channels such that the measurement cycles Tp of all of the channels are controlled and maintained to be constant by extending the charging time of the NG channel and shortening the charging time of the OK channel in each of the measurement cycles Tp. In addition, the procedure of the voltage measurement control in the second embodiment (FIG. 7, FIG. 8) is merely one example, and the voltage measurement control is not limited to this procedure. However, it is preferred to perform the measurement on all of the channels while the measurement cycles Tp of all of the channels are controlled and maintained to be constant by extending the charging time of the NG channel to perform the remeasurement thereon and shortening the charging time of the following OK channel in the certain measurement cycle Tp.

(2) Modified Example 2

In the first and second embodiments, the charging time of the OK channel is shortened.

However, the charging times of some of the OK channels may be constant. Also, in this case, it is preferred to set such that the total extension time of the charging times of the NG channels and the total shortened time of the charging times of the OK channels are equal to or shorter than the non-measurement period Me (FIG. 2). In this way, the measurement cycle Tp can be maintained to be constant while the measurement period Te fluctuates.

The disclosure is not limited to the above-described embodiments, examples, and modified examples and can be realized in various configurations within. the scope that does not depart from the gist thereof. For example, technical features in the embodiments, the examples, and the modified examples that correspond to technical features in each aspect described in SUMMARY can appropriately be replaced or combined to solve a part or a whole of the above-described problem or to achieve a part or a whole of the above-described effect. In addition, unless being described as essential in this specification, any of the technical features can appropriately be deleted.

What is claimed is:

1. A voltage measurement method comprising:

sequentially connecting m channels, for which n battery cells are divided, in a battery cell unit, in which then battery cells are connected in series, to a capacitor via a connection circuit and measuring a channel voltage per the channel, m being an integer equal to or smaller than n, and n being an integer equal to or larger than two; and comparing a deviation of a measured channel voltage from a reference voltage with a permissible deviation value, wherein for an abnormal channel whose deviation of the measured channel voltage from the reference voltage is larger than the permissible deviation value, measurement is performed by extending a charging time for charging the capacitor, and for a normal channel whose deviation is equal to or smaller than the permissible deviation value, the measurement is performed by shortening the charging time for charging the capacitor so as to maintain a measurement cycle, in which the measurement on all of the channels is performed, to be constant.

2. The voltage measurement method according to claim 1, wherein in a case where the abnormal channel exists among the channels on which the measurement is performed in a certain measurement cycle, the charging time during the measurement on the abnormal channel is extended in a next measurement cycle, and the charging time during the measurement on the normal channel is shortened in the next measurement cycle.

3. The voltage measurement method according to claim 1, wherein in a case where the channel on which the measurement is performed in a certain measurement cycle is the abnormal channel, the charging time of the abnormal channel is extended to perform remeasurement on the abnormal channel in the same measurement cycle, and the charging time of the normal channel on which the measurement is performed after the abnormal channel is shortened in the same measurement cycle.

4. The voltage measurement method according to claim 1, wherein the measurement cycle is divided into two periods of a measurement period in which the measurement on the m channels is performed and a non-measurement period that follows the measurement period, and the measurement period is maintained to be constant.

5. The voltage measurement method according to claim I, wherein the reference voltage is an average voltage of the channel voltages that are measured from a plurality of the channels.

6. The voltage measurement method according to claim 1, wherein when the charging time of the normal channel is shortened, a plurality of the charging times of the normal channels is equally shortened.

7. The voltage measurement method according to claim 1, wherein the charging times of all of the channels are set to a reference charging time when voltage measurement in the next measurement cycle is started from a certain measurement cycle.

8. The voltage measurement method according to claim I further comprising comparing an extended charging time of the abnormal channel with a specified upper limit charging time and determining that the abnormal channel is a malfunctioning channel in a case where the extended charging time exceeds the upper limit charging time.

* * * * *